(12) United States Patent
Lee et al.

(10) Patent No.: US 11,054,449 B2
(45) Date of Patent: Jul. 6, 2021

(54) METHOD AND DEVICE FOR DETERMINING TRANSMISSION POWER IN MULTI-ANTENNA COMMUNICATION SYSTEM

(71) Applicant: Samsung Electronics Co., Ltd., Suwon-si (KR)

(72) Inventors: Byung Moo Lee, Yongin-si (KR); Jong Ho Bang, Yongin-si (KR); Jin Hyeock Choi, Yongin-si (KR); Byung Chang Kang, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 164 days.

(21) Appl. No.: 14/385,409

(22) PCT Filed: Mar. 13, 2013

(86) PCT No.: PCT/KR2013/002007
§ 371 (c)(1),
(2) Date: Sep. 15, 2014

(87) PCT Pub. No.: WO2013/137638
PCT Pub. Date: Sep. 19, 2013

(65) Prior Publication Data
US 2015/0070225 A1    Mar. 12, 2015

(30) Foreign Application Priority Data

Mar. 13, 2012  (KR) .................. 10-2012-0025801

(51) Int. Cl.
*G01R 21/133* (2006.01)
*H04W 52/42* (2009.01)
(Continued)

(52) U.S. Cl.
CPC .......... *G01R 21/133* (2013.01); *G01R 29/08* (2013.01); *H04W 52/42* (2013.01); *H04B 7/0413* (2013.01)

(58) Field of Classification Search
CPC combination set(s) only.
See application file for complete search history.

(56) References Cited

U.S. PATENT DOCUMENTS 8,503,291 B1 *  8/2013  Lee ...................... H04B 7/0456
                                                370/225
8,996,066 B1 *  3/2015  Lee ...................... H04W 72/082
                                                455/562.1
(Continued)

FOREIGN PATENT DOCUMENTS

KR    10-2007-0025379 A    3/2007
KR    10-2011-0027591 A    3/2011
(Continued)

OTHER PUBLICATIONS

Xu et al., "Energy-Efficient Power Allocation between Pilots and Data Symbols in Downlink OFDMA Systems", 2011, IEEE.*

*Primary Examiner* — Zhiyu Lu
(74) *Attorney, Agent, or Firm* — Jefferson IP Law, LLP

(57) ABSTRACT

A method and a device for determining transmission power in a multi-antenna communication system are provided. The method for determining transmission power includes calculating the power consumption of a transmission device, calculating the capacity of the transmission device, and determining transmission power for maximizing the energy efficiency of the transmission device by using the power consumption and the capacity thereof.

7 Claims, 14 Drawing Sheets

(a)

(b)

(51) Int. Cl.
   *G01R 29/08*   (2006.01)
   *H04B 7/0413*  (2017.01)

(56) References Cited

U.S. PATENT DOCUMENTS

| | | | |
|---|---|---|---|
| 2005/0070323 A1 | 3/2005 | Lozano et al. | |
| 2007/0054633 A1* | 3/2007 | Piirainen | H04B 7/0697 455/115.3 |
| 2007/0254608 A1* | 11/2007 | Bougard | H04B 7/0689 455/103 |
| 2009/0067355 A1* | 3/2009 | Haartsen | H04W 72/08 370/311 |
| 2009/0069057 A1* | 3/2009 | Haartsen | H04W 72/085 455/574 |
| 2009/0190685 A1* | 7/2009 | Kimura | H04L 5/0044 375/267 |
| 2009/0279486 A1 | 11/2009 | Kishigani et al. | |
| 2009/0296626 A1* | 12/2009 | Hottinen | H04B 7/155 370/315 |
| 2011/0003609 A1 | 1/2011 | Sundstrom et al. | |
| 2012/0033575 A1* | 2/2012 | Zhang | H04B 7/0647 370/252 |
| 2013/0229943 A1* | 9/2013 | Huang | H04W 52/12 370/252 |

FOREIGN PATENT DOCUMENTS

| | | |
|---|---|---|
| KR | 10-1099621 B1 | 12/2011 |
| WO | 00/59121 A1 | 10/2000 |
| WO | 2005/060287 A1 | 6/2005 |

\* cited by examiner

METHOD AND DEVICE FOR DETERMINING TRANSMISSION POWER IN MULTI-ANTENNA COMMUNICATION SYSTEM

CROSS-REFERENCE TO RELATED APPLICATION(S)

This application is a U.S. National Stage application under 35 U.S.C. § 371 of an International application filed on Mar. 13, 2013 and assigned application number PCT/KR2013/002007, which claimed the benefit of a Korean patent application filed on Mar. 13, 2012 in the Korean Intellectual Property Office and assigned Serial number 10-2012-0025801, the entire disclosure of which is hereby incorporated by reference.

TECHNICAL FIELD

The present disclosure relates to a transmission power determining method and device. More particularly, the present disclosure relates to a transmission power determining method and device that may optimize an energy efficiency in view of a transmission capacity in a multi-antenna communication system.

BACKGROUND

A conventional communication system may be designed to maximize a transmission capacity, and use a maximum power of a power amplifier (PA) to transmit a signal in accordance with the design. For example, Korean Patent Publication No. 2010-0064318 discloses an apparatus for transmission in a multiple input multiple output (MIMO) system that may control electric power allocated to each user data to be similar based on error performances of all users and improve an average error performance of the system.

For another example, Korean Patent Publication No. 2009-0039827 discloses a method and an apparatus for mode selection in a MIMO system that may generate a mode selection table using various elements of data included in a received signal in a multiple antenna system and maintain a high channel capacity by selecting a transmission mode.

However, in data transmission, the importance of power efficiency in addition to a capacity have become increasingly important due to a drastic increase in data transmission. Accordingly, there is a need in the art for a method of determining a transmission power of a transmission device to optimize power efficiency.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a transmission power determining method and device that may optimize an energy efficiency in view of a transmission capacity in a multi-antenna communication system.

In accordance with an aspect of the present disclosure, a method of determining a transmission power is provided. The method includes calculating a power consumption of a transmitter, calculating a capacity of the transmitter, and determining the transmission power for maximizing an energy efficiency of the transmitter.

In accordance with an aspect of the present disclosure, a method of determining a transmission power is provided. The method includes extracting at least one from parameters of a transmitter including antennas and a receiver, and determining an optimal transmission power of the transmitter using the parameter.

In accordance with an aspect of the present disclosure, a device for determining a transmission power is provided. The device includes a power consumption calculator to calculate a power consumption of a transmitter, a capacity calculator to calculate a capacity of the transmitter, and a transmission power determiner to determine the transmission power for maximizing an energy efficiency of the transmitter based on the calculated power consumption and the calculated capacity.

In accordance with another aspect of the present disclosure, a device for determining a transmission power is provided. The device includes a parameter extractor to extract at least one from parameters of a transmitter including antennas and of a receiver, and a transmission power determiner to determine an optimal transmission power of the transmitter using the parameter.

In accordance with another aspect of the present disclosure, a transmission power of a transmitter that may optimize an energy efficiency may be determined in view of a channel capacity in a multi-antenna communication system.

In accordance with another aspect of the present disclosure, a transmission power of a transmitter that may optimize an energy efficiency may be determined using various parameters associated with the transmitter and a receiver.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
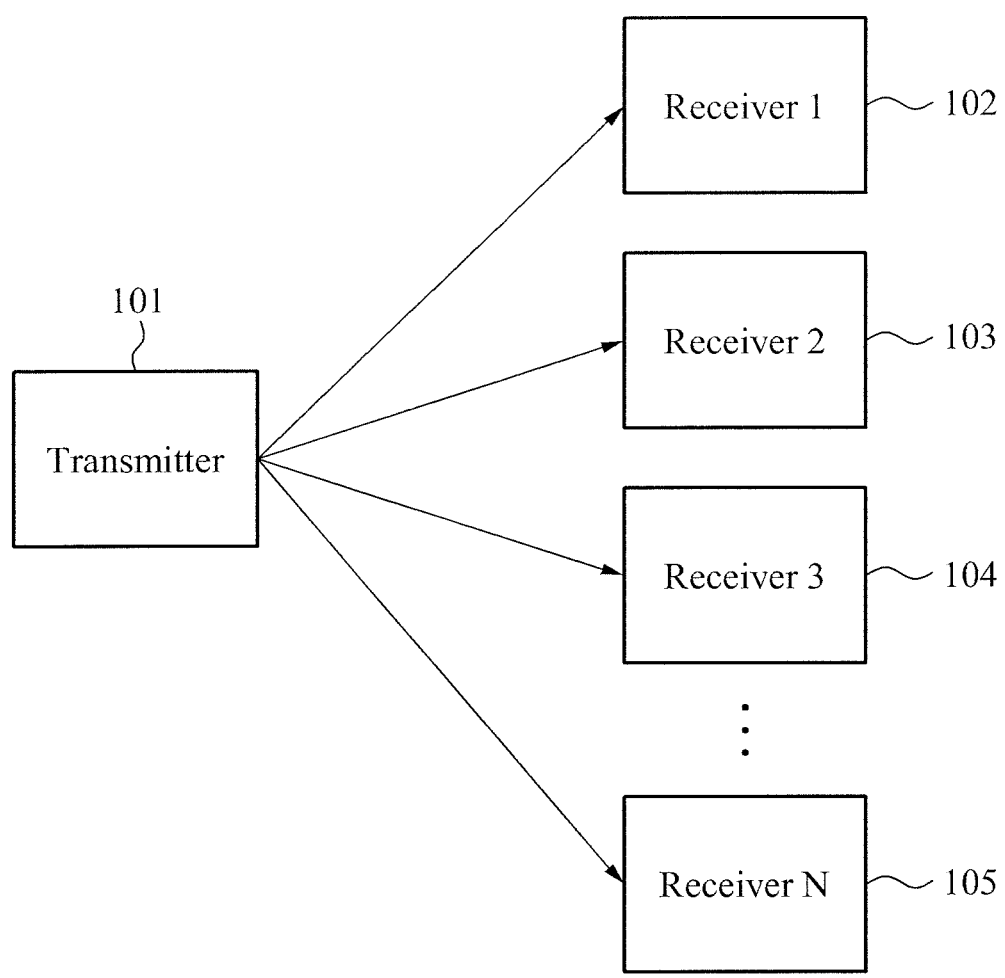
FIG. 1 illustrates a schematic diagram according to various embodiments of the present disclosure.

FIG. 1 illustrates a schematic diagram according to various embodiments of the present disclosure.

Referring to FIG. 1, a transmitter 101 transmits data to N receivers, for example, 102 through 105.

According to an embodiment of the present disclosure, the transmitter 101 transmits the data based on a transmission power that may maximize energy efficiency while minimizing a reduction in a channel capacity associated with the receivers 102 through 105. A method proposed herein may be suitable for a next-generation system requiring energy reduction because the transmission power is determined based on the energy efficiency in addition to the channel capacity.

Figure 2:
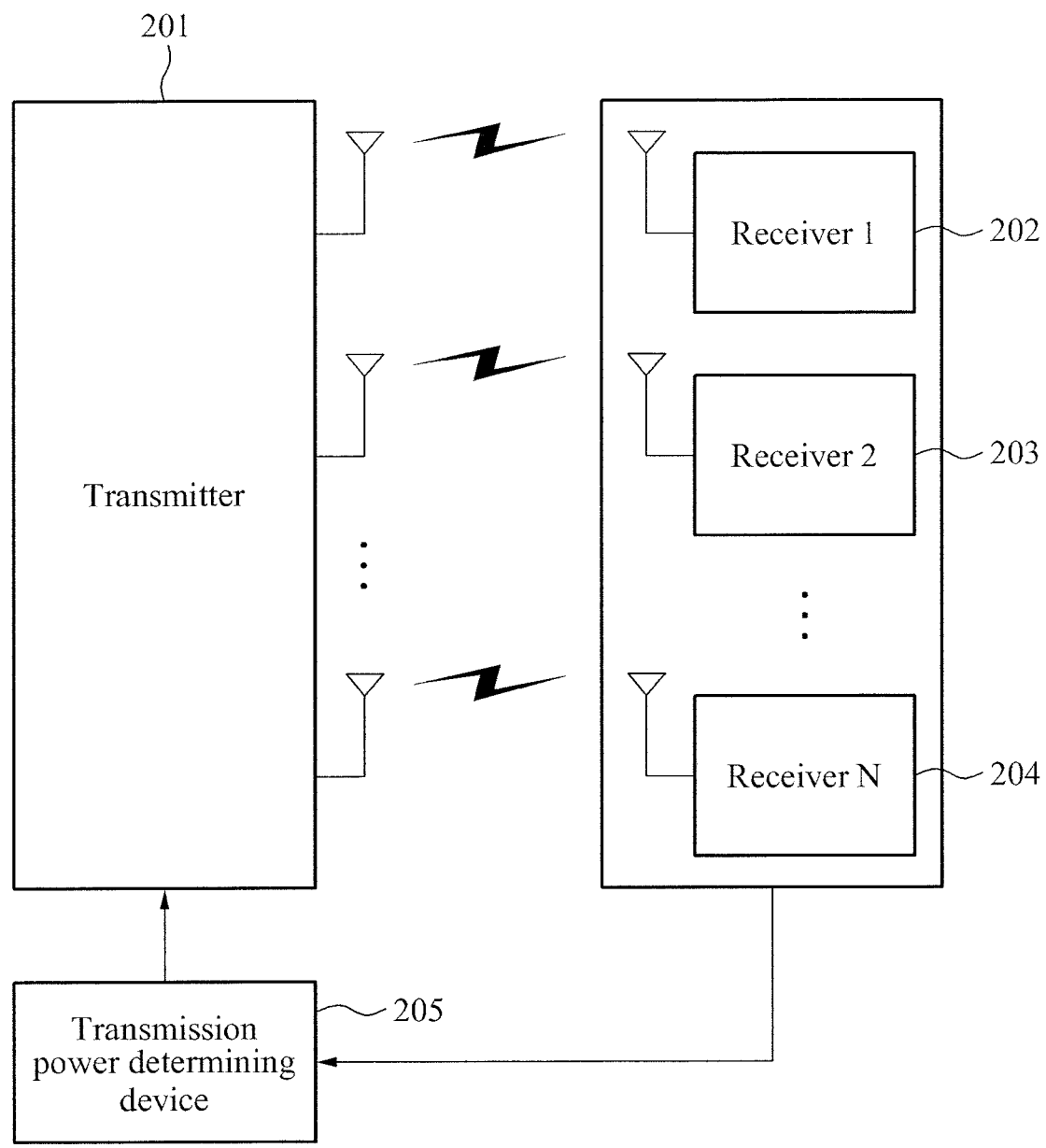
FIG. 2 is a diagram illustrating an example of an operation of a transmission power determining device according to various embodiments of the present disclosure.

FIG. 2 is a diagram illustrating an example of an operation of a transmission power determining device according to various embodiments of the present disclosure.

Referring to FIG. 2, a transmitter 201 includes a plurality of antennas. The transmitter 201 transmits data to each receiver, for example, 202 through 204, through the antennas. In FIG. 2, each of the receivers 202 through 204 includes a single antenna, but is not limited thereto. A number of the antennas of the transmitter 201 may be greater than a number of antennas included in each of the receiver 202 through 204.

The transmission power determining device 205 determines a transmission power required for the transmitter 201 to transmit the data to the receivers 202 through 204. The transmission power determining device 205 may be independently disposed from the transmitter 201 or disposed in the transmitter 201. As described in the foregoing, the transmission power determining device 205 may be used for a next-generation communication system requiring energy reduction by determining a transmission power based on energy efficiency in addition to a channel capacity between the transmitter 201 and the receivers 202 through 204.

Figure 3:
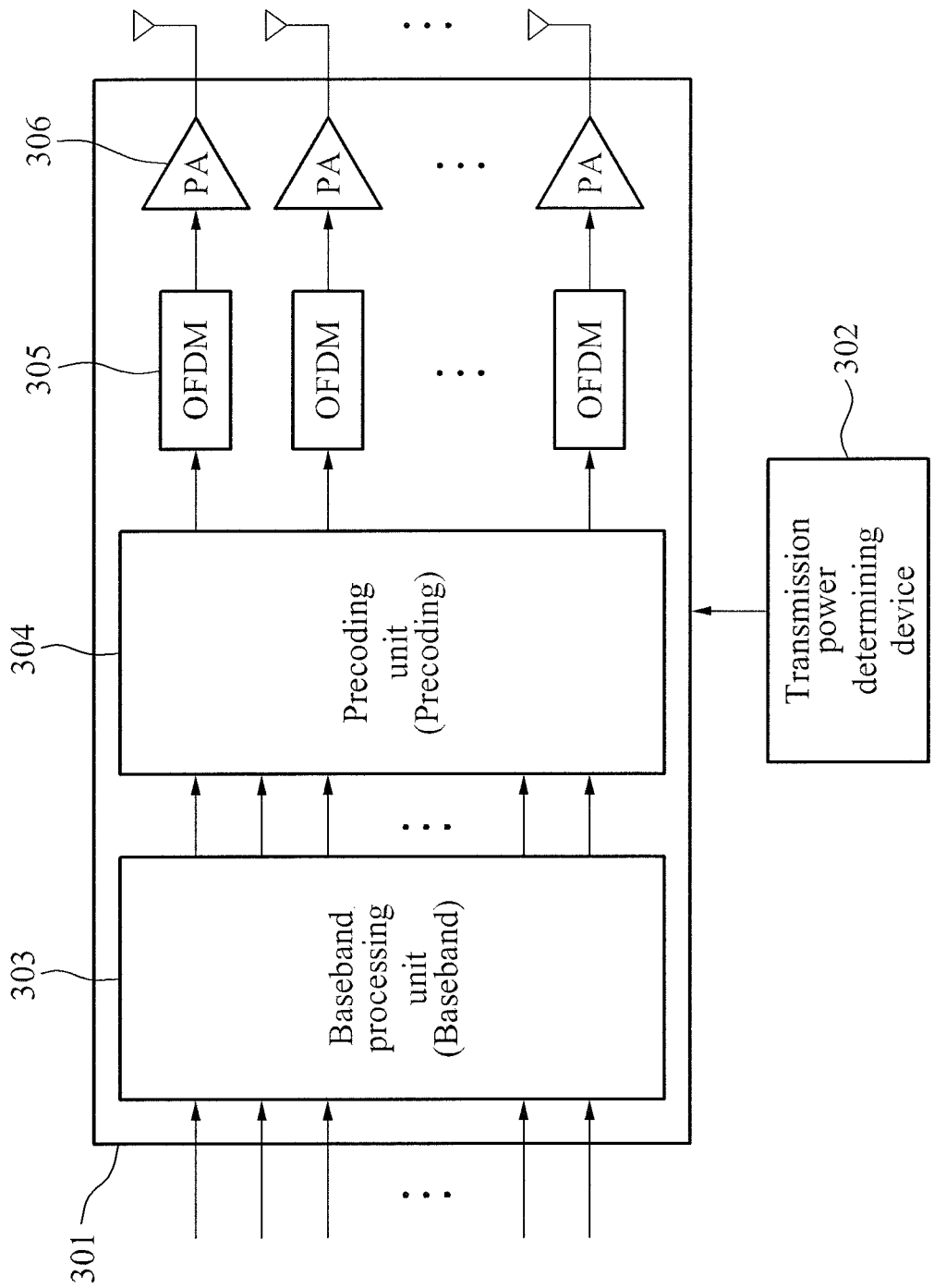
FIG. 3 is a diagram illustrating an example of a configuration of a transmitter according to various embodiments of the present disclosure.

FIG. 3 is a diagram illustrating an example of a configuration of a transmitter according to various embodiments of the present disclosure.

A method of determining a transmission power of the transmitter 301, which is performed by a transmission power determining device 302, will be further described with reference to FIG. 3.

Referring to FIG. 3, in a multi-antenna communication system, the transmitter 301 includes "$N_t$" antennas, and K receivers are present. Here, a receiver includes one antenna. In an example, the transmitter 301 may correspond to a baseband, and the receiver may correspond to a user terminal.

A received signal "y" to be received by the receiver from the transmitter 301 may be determined as expressed in Equation 1.

$$y = \sqrt{P_{tx}} Hs + n \qquad \text{Equation 1}$$

In Equation 1, "y" denotes a received signal vector indicating "K×1." "Ptx" denotes a total transmission power, and "H" denotes a Rayleigh channel matrix indicating "Nt×K." In equation 1, "s" denotes a transmission signal vector indicating "Nt×1," and "n" denotes a noise, for example, additive white Gaussian noise (AWGN), vector indicating "K×1."

In the multi-antenna communication system including a plurality of receivers, the transmitter 301 may perform precoding through a precoding unit 304 to reduce interference among the receivers. The precoding may be classified into linear coding and non-linear coding. In general, the non-linear precoding may exhibit a high degree of complexity despite more desirable performances than the linear precoding.

An example in which the linear precoding is adopted on the presumption that $N_t$ indicating the number of the antennas of the transmitter 301 is high will be described hereinafter. In detail, the multi-antenna communication system, for example, a Multiple Input Multiple Output (MIMO) communication system in which $N_t$ is significantly high, may not obtain an optimal performance only using the linear precoding.

Referring to Table 1 below, the linear precoding is classified into matched filtering (MF) precoding, zero-forcing (ZF) precoding, and regularized zero-forcing (RZF) precoding, among which the MF precoding and the ZF precoding are used.

TABLE 1

|   | MF | ZF | RZF |
|---|---|---|---|
| F | $N_t^{-1} H^H$ | $H^H (HH^H)^{-1}$ | $H^H (HH^H + \nu I_K)^{-1}$ |

When the transmitter 301 performs the precoding, the transmission signal vector "s" may be expressed as Equation 2.

$$s = \zeta F x \quad \text{Equation 2}$$

Thus, the received signal vector "y" may be modified to Equation 3.

$$y = \sqrt{P_{tx}} H \zeta F x + n \quad \text{Equation 3}$$

In Equation 3, "$\zeta$" denotes a regularized factor of a transmission power, and "F" denotes a precoding matrix of "$N_t \times K$."

Here, $\|\zeta F x\|^2 = 1$ is required to be met and thus, $\zeta$ may be expressed as Equation 4.

$$\zeta \approx \sqrt{\frac{N_t}{K}} \quad \text{Equation 4}$$

Thus, a received signal of a k-th receiver among the plurality of the receivers may be expressed as Equation 5.

$$y_k = \sqrt{\frac{P_{tx} N_t}{K}} h_k f_k + n_k + \sqrt{\frac{P_{tx} N_t}{K}} \sum_{l \ne k} h_k f_l \quad \text{Equation 5}$$

In Equation 5, "$h_i$," "$f_l$," "$f_k$," and "$n_k$" denote a channel vector of an i-th receiver, a precoding vector of an l-th receiver, a precoding vector of the k-th receiver, and noise of the k-th receiver, respectively.

Here, an effective signal-to-interference-plus-noise ratio (SINR) of a receiver may be expressed as Equation 6.

$$\gamma_k = \frac{\frac{P_{tx} N_t}{K} |h_k f_k|^2}{\frac{P_{tx} N_t}{K} \left|\sum_{l \ne k} h_k f_l\right|^2 + N_0 B} \quad \text{Equation 6}$$

In Equation 6, "$\gamma_k$" denotes the effective SINR, and "$N_0 B$" denotes a noise power when a bandwidth is "B."

As described in the foregoing, when $N_t$ is significantly high, Equation 7 may be obtained.

$$H H^H \rightarrow N_t I_k \quad \text{Equation 7}$$

When the MF precoding is applied to the transmitter 301, the effective SINR may be expressed as Equation 8.

$$\frac{\frac{P_{tx} N_t}{K} |h_k h_k^H|^2}{\frac{P_{tx} N_t}{K} \left|\sum_{l \ne k} h_k h_k^H\right|^2 + N_0 B} \rightarrow \frac{N_t P_{tx}}{K} \quad \text{Equation 8}$$

Energy efficiency (EE) of the transmitter 301 may be required to be obtained. The energy efficiency may be defined based on a sum power as expressed in Equation 9. The sum power is defined herein as a tractable model.

$$P_{sum} = P_{PA} + P_{Cir} \quad \text{Equation 9}$$

In Equation 9, "$P_{PA}$" denotes a power consumption of a power amplifier 306 included in the transmitter 301, and "$P_{cir}$" denotes a power consumption of a remainder on a circuit from which the power amplifier 306 is excluded.

Here, a relationship between the total transmission power "$P_{tx}$" and $P_{PA}$ may be expressed as Equation 10.

$$P_{tx} = \eta P_{PA} \quad \text{Equation 10}$$

In Equation 10, "$\eta$" denotes an efficiency of the power amplifier 306. For example, when "back-off 11 decibel (dB)" and "78.5% of class-B power amplifier (PA) efficiency" based on an orthogonal frequency-division multiplexing (OFDM) peak-to-average power ratio (PAPR) are reflected as illustrated in FIGS. 8 through 14B, $\eta$ may be 22%.

Here, $P_{cir}$ may be expressed as Equation 11.

$$P_{Cir} = P_{BB} + N_t P_{RFfront} \quad \text{Equation 11}$$

In Equation 11, "$P_{BB}$" and "$P_{RFfront}$" denote a power consumption of a baseband processing unit 303 and a power consumption of a radio frequency (RF) front end, respectively. The RF front end may include a digital-to-analog converter (DAC), a mixer, and a transmission filter (Tx filter). As an example, in FIGS. 8 through 14B, $P_{RFfront}$ is given as 97.5 milliwatts (mW).

A channel capacity may be obtained first to obtain the energy efficiency of the transmitter 301. Here, in view of Equation 6, the channel capacity in a unit cell may be expressed as Equation 12.

$$C = \alpha B \cdot \sum_{k=1}^{K} \left[ \log_2 \left( 1 + \frac{\frac{P_{tx} N_t}{K} |h_k f_k|^2}{\frac{P_{tx} N_t}{K} \left|\sum_{l \ne k} h_k f_l\right|^2 + N_0 B} \right) \right] \quad \text{Equation 12}$$

In Equation 12, "C" denotes the channel capacity, and "$\alpha$" denotes a scaling factor based on an OFDM guard interval.

As described in the foregoing, the number of the antennas of the transmitter 301 is given to be greater than a number of antennas of a receiver. Accordingly, Equation 12 may be simplified as Equation 13.

$$C_{approx} \approx \alpha B K \cdot \left[ \log_2 \left( 1 + \frac{\frac{P_{tx} N_t}{K}}{I + N_0 B} \right) \right] \quad \text{Equation 13}$$

In Equation 13, "I" denotes interference. The interference may be eliminated through precoding. When the ZF precoding is applied, the interference may be disregarded from Equation 13. Thus, Equation 13 may be expressed as Equation 14.

$$C_{ZF} \approx \alpha B K \cdot \left[ \log_2 \left( 1 + \frac{P_{tx} N_t}{K} \right) \right] \quad \text{Equation 14}$$

When the obtained channel capacity and the power consumption are used, the energy efficiency may be obtained as expressed in Equation 15.

$$EE = C/P_{sum} \quad \text{Equation 15}$$

Thus, an optimal transmission power for the transmitter 301 may be obtained based on Equation 16.

$$\frac{\partial}{\partial P_{tx}} EE \approx \frac{C_{approx}}{\frac{1}{\eta} P_{tx} + P_{Cir}} \quad \text{Equation 16}$$

$$= \frac{BKN_t \left( \frac{1}{\eta} P_{tx} + P_{Cir} \right)}{K(N_0 B + I)\left( 1 + \frac{N_t P_{tx}}{K(N_0 B + I)} \right)} -$$

$$\frac{1}{\eta} BK \cdot \log\left( 1 + \frac{NtP_{tx}}{K(N_0 B + I)} \right)$$

$$= 0$$

In Equation 16, "$P_{tx}^{opt}$" denotes the optimal transmission power for the transmitter 301. When the interference "I" is given as a constant, $P_{tx}^{opt}$ may be expressed as Equation 17.

$$P_{tx}^{opt} \approx \frac{KN_0 B}{N_t}(-1 + \exp(1 + W(\Gamma))) \quad \text{Equation 17}$$

In Equation 17, "W" denotes a Lambert W function, and "Γ" may be expressed as Equation 18.

$$\Gamma = W(\Gamma) \exp(W(\Gamma)) \quad \text{Equation 18}$$

"Γ" may be expressed in detail as Equation 20.

$$\Gamma = \frac{-\frac{1}{\eta} KI - \frac{1}{\eta} K(I + N_0 B) + N_t P_{Cir}}{\frac{1}{\eta} K(I + N_0 B) \exp(1)} \quad \text{Equation 19}$$

According to an embodiment, when the ZF precoding is applied, the interference I may be expressed as "0." However, when the MF precoding is applied, the interference I may not be expressed as "0" because I is a $P_{tx}$ function and thus, expressed as "I~m/$P_{tx}$."

When the MF precoding is applied, $P_{tx}^{opt}$ may be obtained based on Equation 20.

$$\frac{\partial}{\partial P_{tx}} EE \approx \frac{C_{approx}}{\frac{1}{\eta} P_{tx} + P_{Cir}} \quad \text{Equation 20}$$

$$= \frac{BK \left( \frac{N_t \frac{1}{m} P_{tx}}{K\left(N_0 B + \frac{1}{m} P_{tx}\right)^2} + \frac{N_t}{K\left(N_0 B + \frac{1}{m} P_{tx}\right)} \right)}{\left( 1 + \frac{N_t P_{tx}}{K\left(N_0 B + \frac{1}{m} P_{tx}\right)} \right)} -$$

$$\frac{\frac{1}{\eta} BK \log\left( 1 + \frac{N_t P_{tx}}{K(N_0 B + I)} \right)}{\left( \frac{1}{\eta} P_{tx} + P_{Cir} \right)}$$

$$= 0$$

As expressed in Equation 16 or Equation 20, $P_{tx}^{opt}$ may be obtained using various parameters associated with the transmitter 301 and the receivers. In $P_{tx}^{opt}$ may detail, be obtained using the parameters including, for example, the number "$N_t$" of the antennas of the transmitter 301, the number "K" of the receivers or the number "K" of antennas of the receivers, the bandwidth "B", the efficiency "η" of the power amplifier 306, the noise power "$N_0$," the interference "I," the power consumption "$P_{BB}$" associated with the baseband processing unit 303, and the power consumption "$P_{PA}$" associated with the power amplifier 306.

Such parameters may be applied to a transmission power to be radiated through the power amplifier 306 and thus, the transmission power may be optimized. The parameters described in the foregoing may vary depending on a situation of the communication system. For example, $N_t$ may be periodically changed based on an antenna selection method. In addition, K may vary because K is a random function. Further, when carrier aggregation technology and cognitive radio technology are applied, the bandwidth B may also be periodically changed. Accordingly, $P_{tx}^{opt}$ may vary depending on such varying parameters.

When the transmitter 301 is a base station, the foregoing parameters may be periodically fed back from the receivers. The transmission power determining device 302 may store, in a form of a lookup table, a transmission power corresponding to a parameter. The transmission power determining device 302 may then extract a transmission power corresponding to an input parameter and transmit the extracted transmission power to the transmitter 301.

Figure 4:
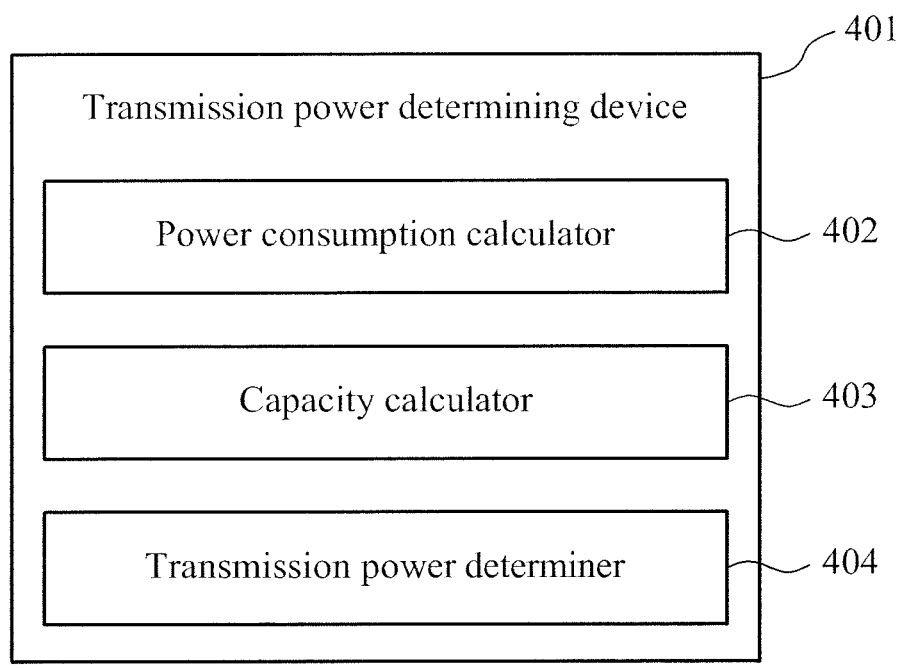
FIG. 4 is a diagram illustrating an example of a transmission power determining device according to various embodiments of the present disclosure.

FIG. 4 is a diagram illustrating an example of a transmission power determining device according to various embodiments of present disclosure.

Referring to FIG. 4, a transmission power determining device 401 includes a power consumption calculator 402, a capacity calculator 403, and a transmission power determiner 404. The transmission power determining device 401 may perform a transmission power determining method to be described with reference to FIG. 6.

Figure 6:
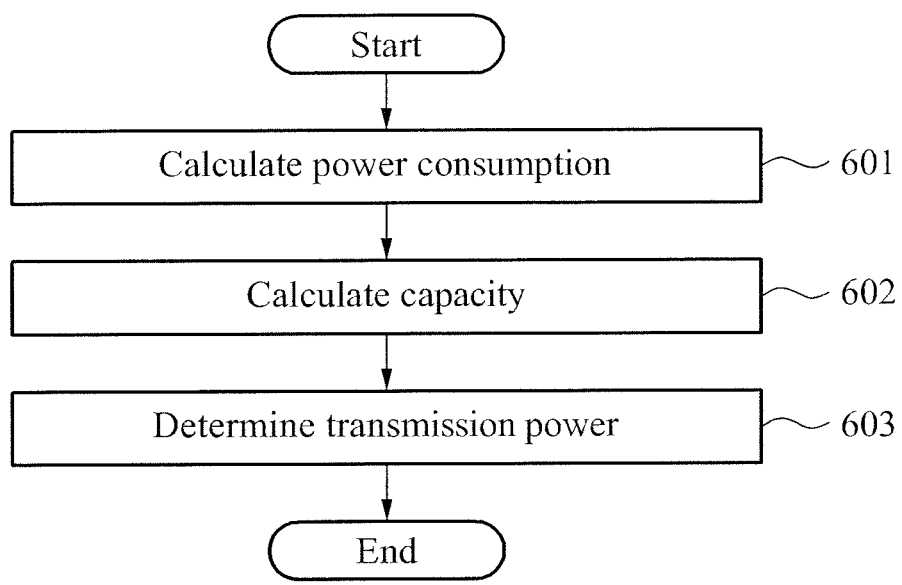
FIG. 6 is a flowchart illustrating an example of a transmission power determining method according to various embodiments of the present disclosure.

Referring to FIG. 6, in operation 601, the power consumption calculator 402 calculates a power consumption of a transmitter. In an example, the power consumption calculator 402 may calculate a power consumption to be used for a power amplifier and an internal circuit of the transmitter. In such an example, the power consumption used for the internal circuit of the transmitter may be extracted based on a power consumption of an RF front end of the transmitter.

In operation 602, the capacity calculator 403 calculates a capacity of the transmitter. The capacity of the transmitter may refer to a channel capacity of a channel to be generated between the transmitter and a receiver. In an example, the capacity calculator 403 may calculate the capacity of the transmitter using an SINR of the receiver corresponding to the transmitter. Here, the SINR may be determined based on at least one of a total transmission power of the transmitter, a number of antennas of the transmitter, a channel vector corresponding to the receiver, a bandwidth and a noise power, and a precoding vector corresponding to the receiver.

In operation 603, the transmission power determiner 404 determines a transmission power to maximize energy efficiency of the transmitter based on the calculated power consumption and the calculated capacity. For a detailed description of operations not described with respect to FIGS. 4 and 6, reference may be made to the description of FIG. 3

Figure 5:
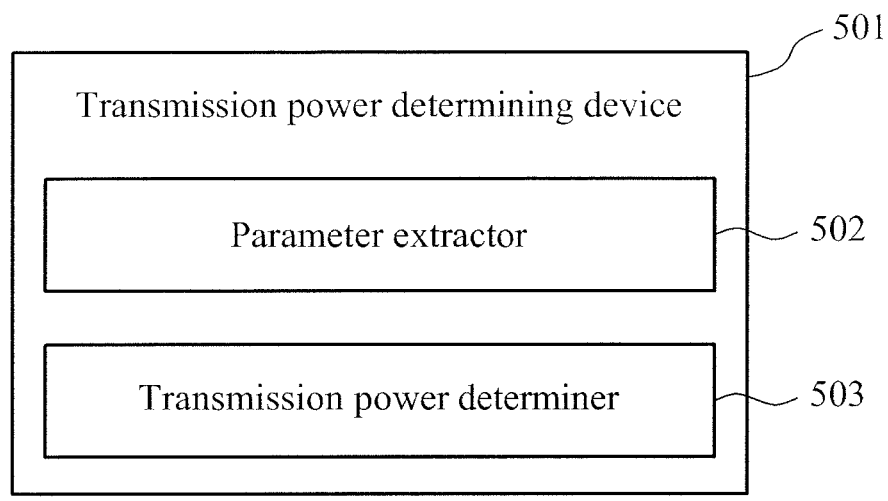
FIG. 5 is a diagram illustrating another example of a transmission power determining device according to various embodiments of the present disclosure.

FIG. 5 is a diagram illustrating another example of a transmission power determining device according to various embodiments of the present disclosure.

Referring to FIG. 5, a transmission power determining device 501 includes a parameter extractor 502 and a transmission power determiner 503. The transmission power determining device 501 may perform a transmission power determining method to be described with reference to FIG. 7.

Figure 7:
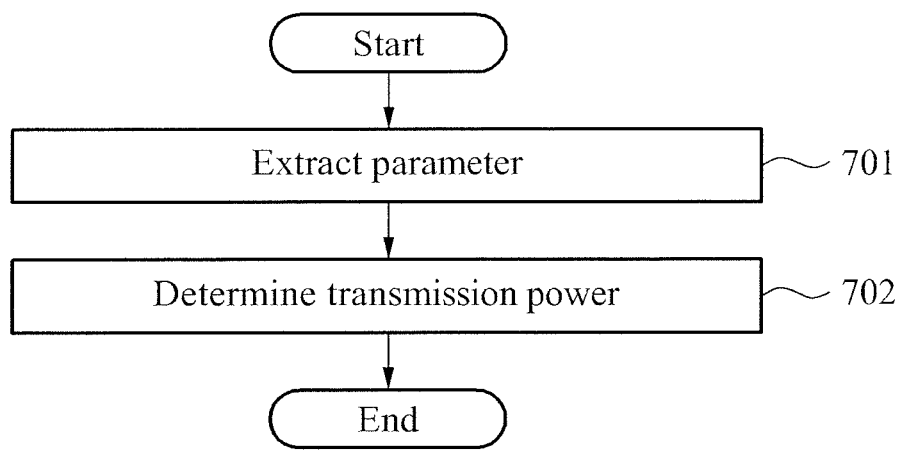
FIG. 7 is a flowchart illustrating another example of a transmission power determining method according to various embodiments of the present disclosure.

Referring to FIG. 7, in operation 701, the parameter extractor 502 extracts at least one parameter from parameters of a transmitter including a plurality of antennas, and a receiver. The parameters of the transmitter and the receiver may be periodically fed back and updated.

In operation 702, the transmission power determiner 503 determines an optimal transmission power of the transmitter using the extracted parameter. In an example, the transmission power determiner 503 may determine the transmission power using, for example, a number of the antennas of the transmitter, a power consumption of the transmitter, a power consumption of an RF front end of the transmitter, a number of antennas of the receiver communicating with the transmitter, a number of receivers present within a cell coverage area of the transmitter, a bandwidth associated with a signal to be transmitted from the transmitter, an efficiency of a power amplifier of the transmitter, an interference associated with the transmitter, and a noise power. In another example, the transmission power determiner 503 may extract, from a lookup table, a transmission power corresponding to the at least one parameter among the parameters of the transmitter and the receiver.

Figure 8:
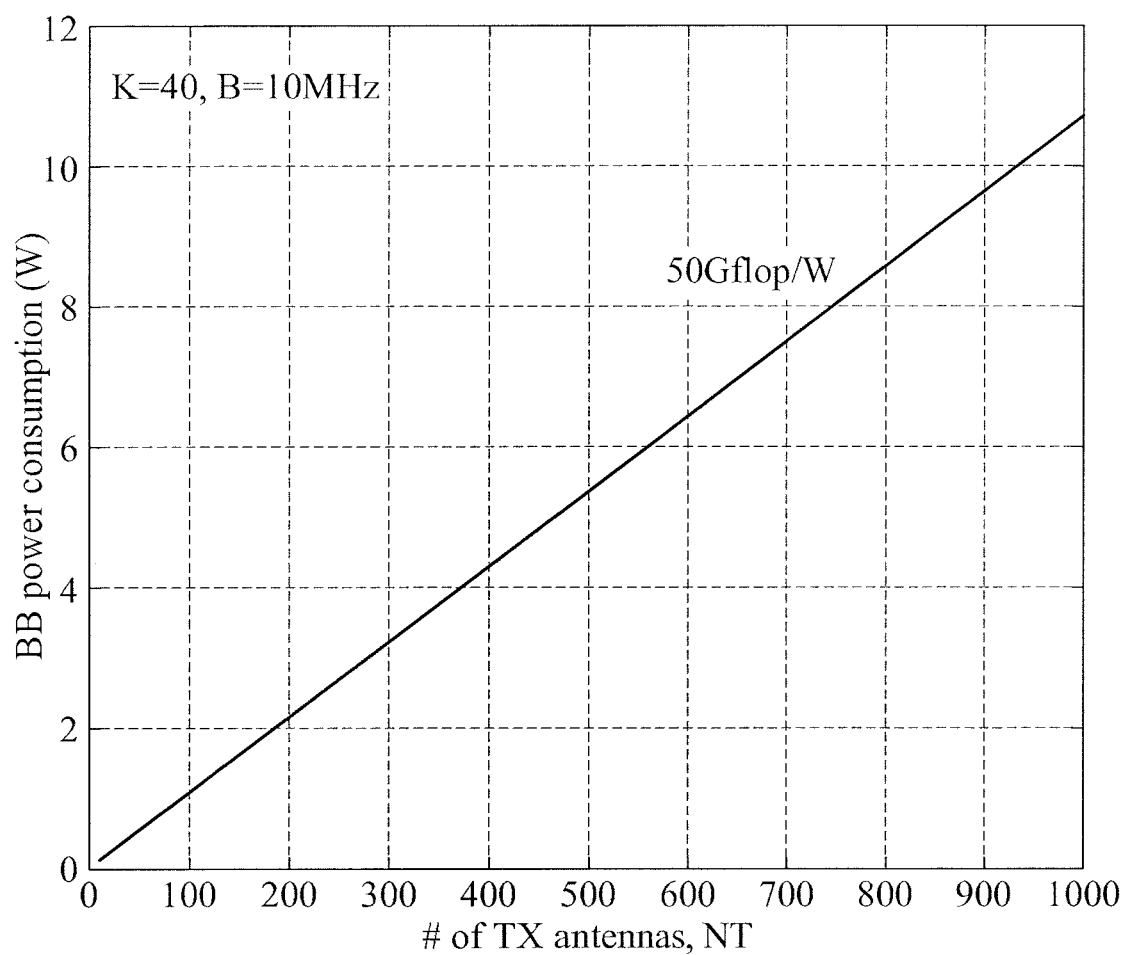
FIG. 8 is a diagram illustrating an example of a change in a power consumption depending on an increase in a number of antennas according to various embodiments of the present disclosure.

FIG. 8 is a diagram illustrating an example of a change in a power consumption based on an increase in a number of antennas according to various embodiments of the present disclosure.

When $P_{BB}$ satisfies 50 gigaflop per watt (Gflop/W) in Equation 11, $P_{BB}$ obtained based on the number "$N_t$" of the antennas of the transmitter may be indicated as in FIG. 8. Referring to FIG. 8, when the number "$N_t$" of the antennas of the transmitter increases, $P_{BB}$ may proportionately increase.

FIGS. 9 through 14B illustrate results obtained using a ZF precoding 2*2 MIMO system using a power amplifier indicating 50 Gflop/W and 22% efficiency. In FIGS. 9 through 14B, lines indicate simulation results, and "+" indicates a result of a mathematical analysis.

Figure 9:
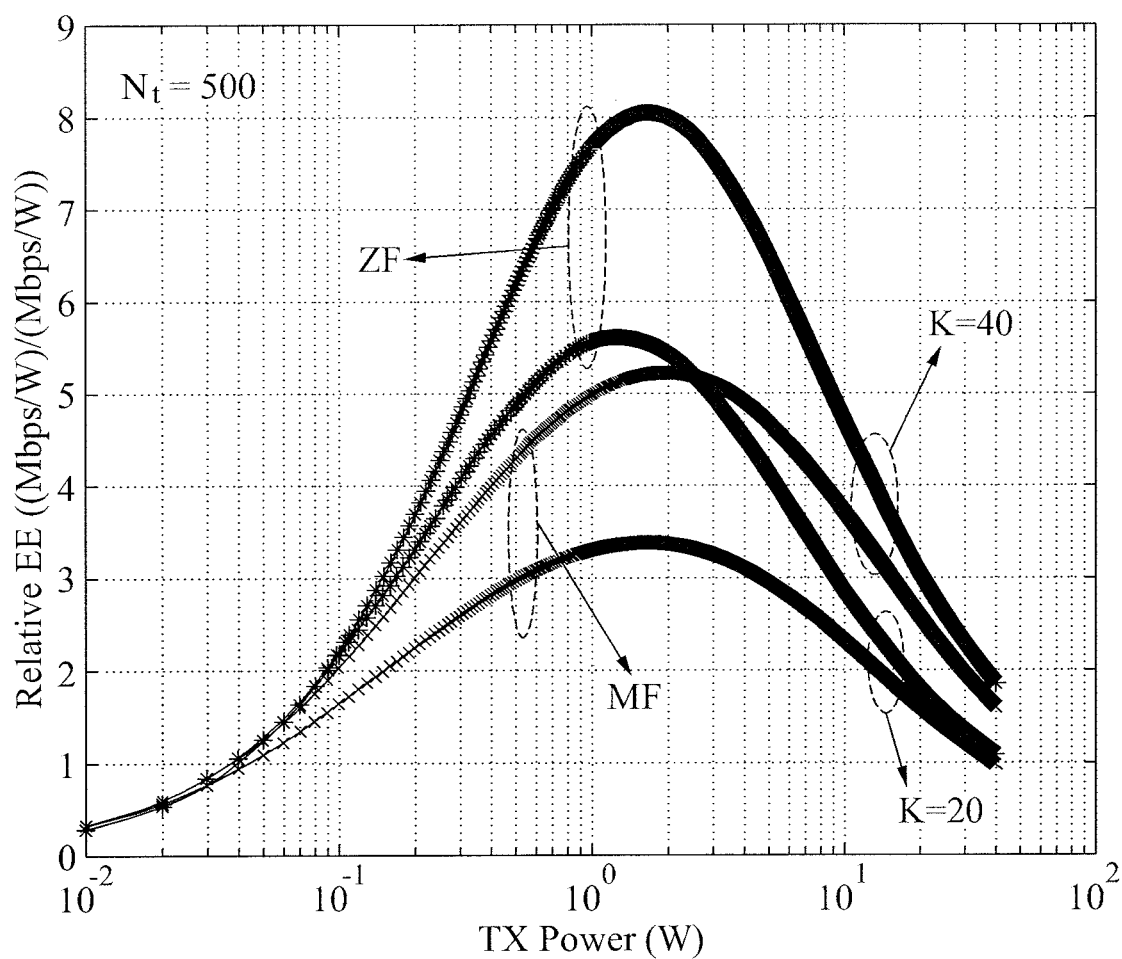
FIG. 9 is a diagram illustrating an example of a process of determining an optimal transmission power according to various embodiments of the present disclosure.

FIG. 9 is a diagram illustrating an example of a process of determining an optimal transmission power according to various embodiments of the present disclosure.

Referring to FIG. 9, in a case of identical K, an energy efficiency obtained when ZF precoding is applied is relatively higher than an energy efficiency obtained when MF precoding is applied. Also, in a case of identical precoding, an energy efficiency is higher when K increases. In FIG. 9, a transmission power corresponding to an inflection point in a graph indicating the energy efficiencies indicates the optimal transmission power. As illustrated in FIG. 9, when a maximum transmission power is 40 watts (W), the optimal transmission power is determined to be significantly lower than the maximum transmission power.

Figure 10:
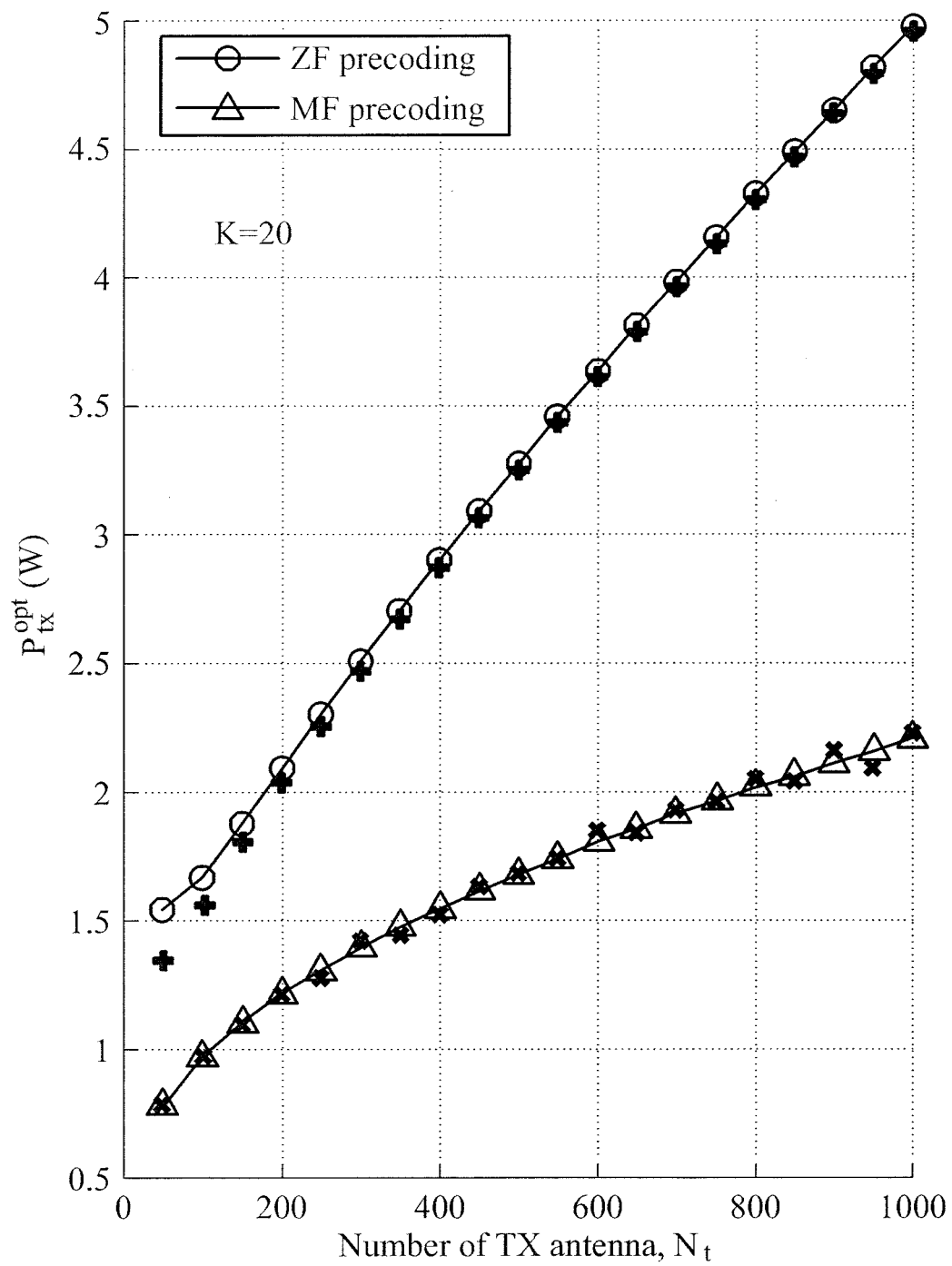
FIG. 10 is a diagram illustrating an example of "$P_{tx}^{opt}$" obtained using zero-forcing (ZF) precoding and matched filtering (MF) precoding according to various embodiments of the present disclosure.

FIG. 10 is a diagram illustrating an example of "$P_{tx}^{opt}$" obtained using ZF precoding and MF precoding according to various embodiments of the present disclosure.

FIG. 10 illustrates an example in which an actual optimal transmission power is determined when a maximum transmission power of a transmitter is 40 W. Referring to FIG. 10, when the ZF precoding is applied, the optimal transmission power may be determined to be approximately 5 W although a number of antennas of the transmitter is practically increased to 1,000. However, when the MF precoding is applied, the optimal transmission power may be determined to be approximately 2.2 W. Concisely, the optimal transmission power of the transmitter may be determined to be significantly lower than the maximum transmission power and thus, an energy efficiency may increase.

Figure 11:
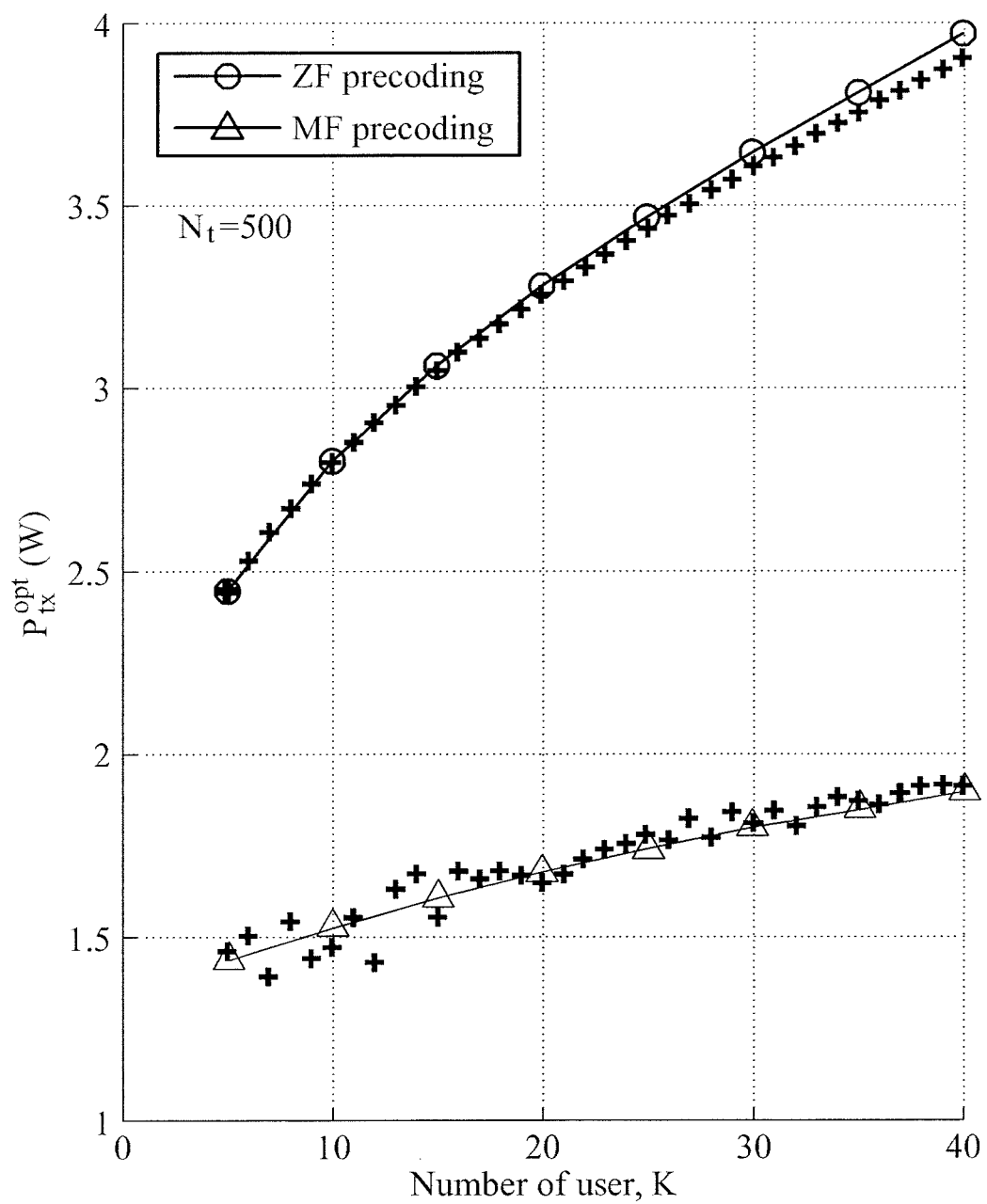
FIG. 11 is a diagram illustrating an example of determining an optimal transmission power based on a number of receivers according to various embodiments of the present disclosure.

FIG. 11 is a diagram illustrating an example of determining an optimal transmission power based on a number "K" of receivers according to various embodiments of the present disclosure.

FIG. 11 illustrates a relationship between the number "K" of the receivers and the optimal transmission power when a number of antennas of a transmitter is 500. Referring to FIG. 11, when the number "K" of the receivers increases, the optimal transmission power increases. However, as illustrated in FIG. 11, the optimal transmission power of the transmitter may be determined to be significantly lower than a maximum transmission power of 40 W.

Figure 12:
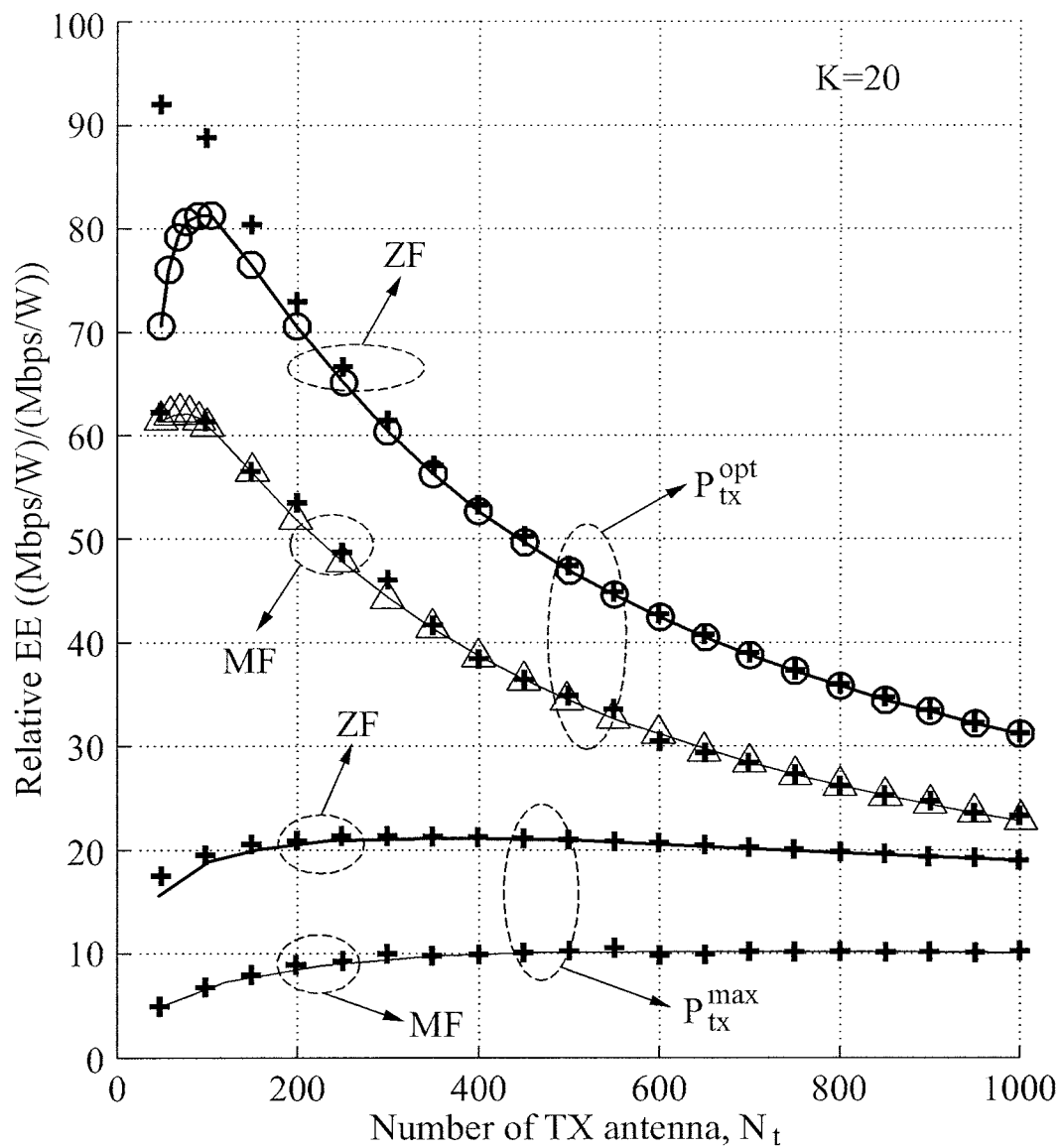
FIG. 12 is a diagram illustrating an example of energy efficiency based on a number of antennas of a transmitter according to various embodiments of the present disclosure.

FIG. 12 is a diagram illustrating an example of an energy efficiency based on a number of antennas of a transmitter according to various embodiments of the present disclosure.

FIG. 12 illustrates a result of comparing energy efficiencies based on the number of the antennas of the transmitter when a number "K" of receivers is fixed. Referring to FIG. 12, an energy efficiency obtained when ZF precoding is applied is higher than an energy efficiency obtained when MF precoding is applied. Also, in a case of identical precoding, an energy efficiency for an optimal transmission power decreases when the number of the antennas of the transmitter increases.

Figure 13:
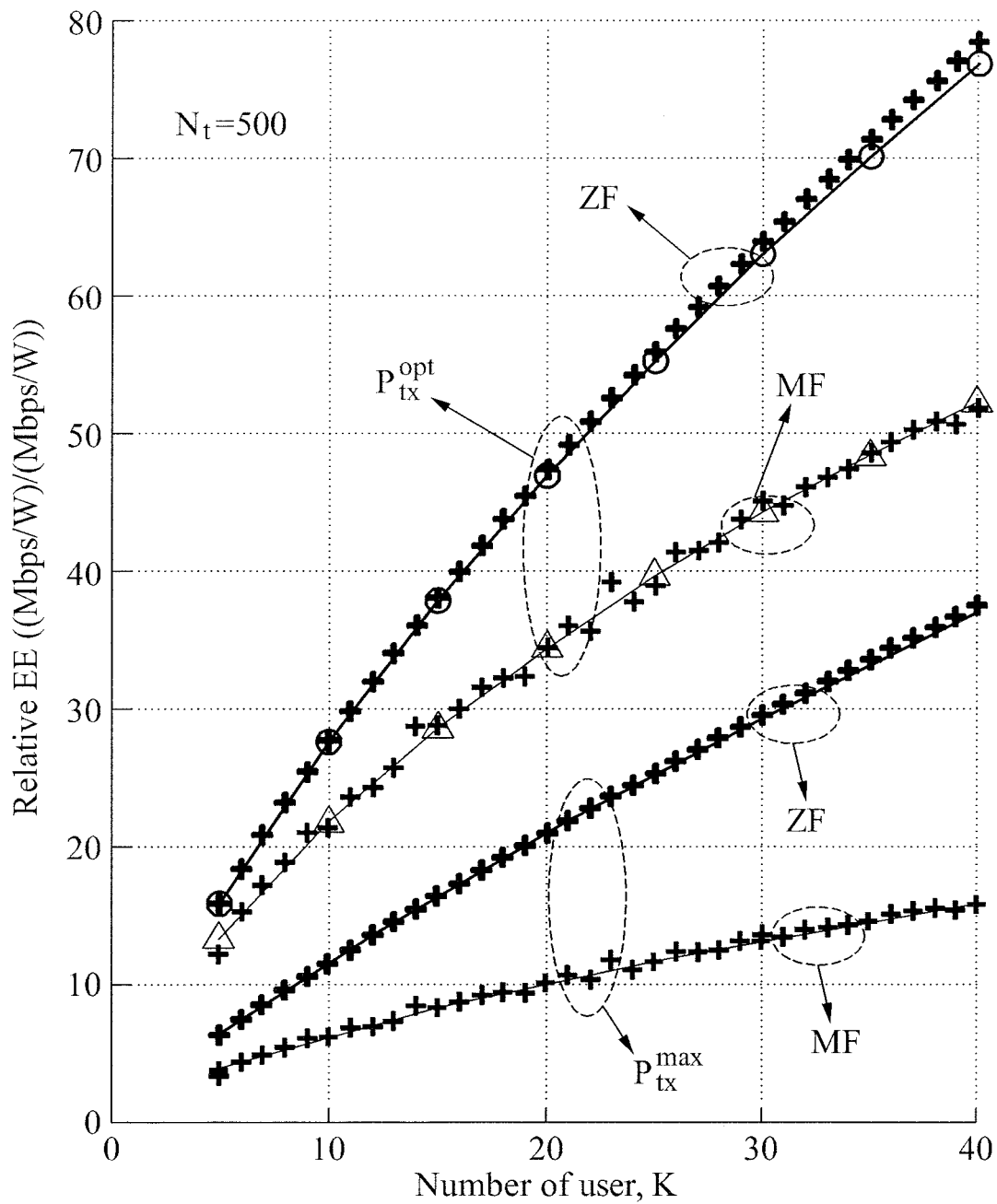
FIG. 13 is a diagram illustrating an example of energy efficiency based on a number of receivers according to various embodiments of the present disclosure.
Figure 14:
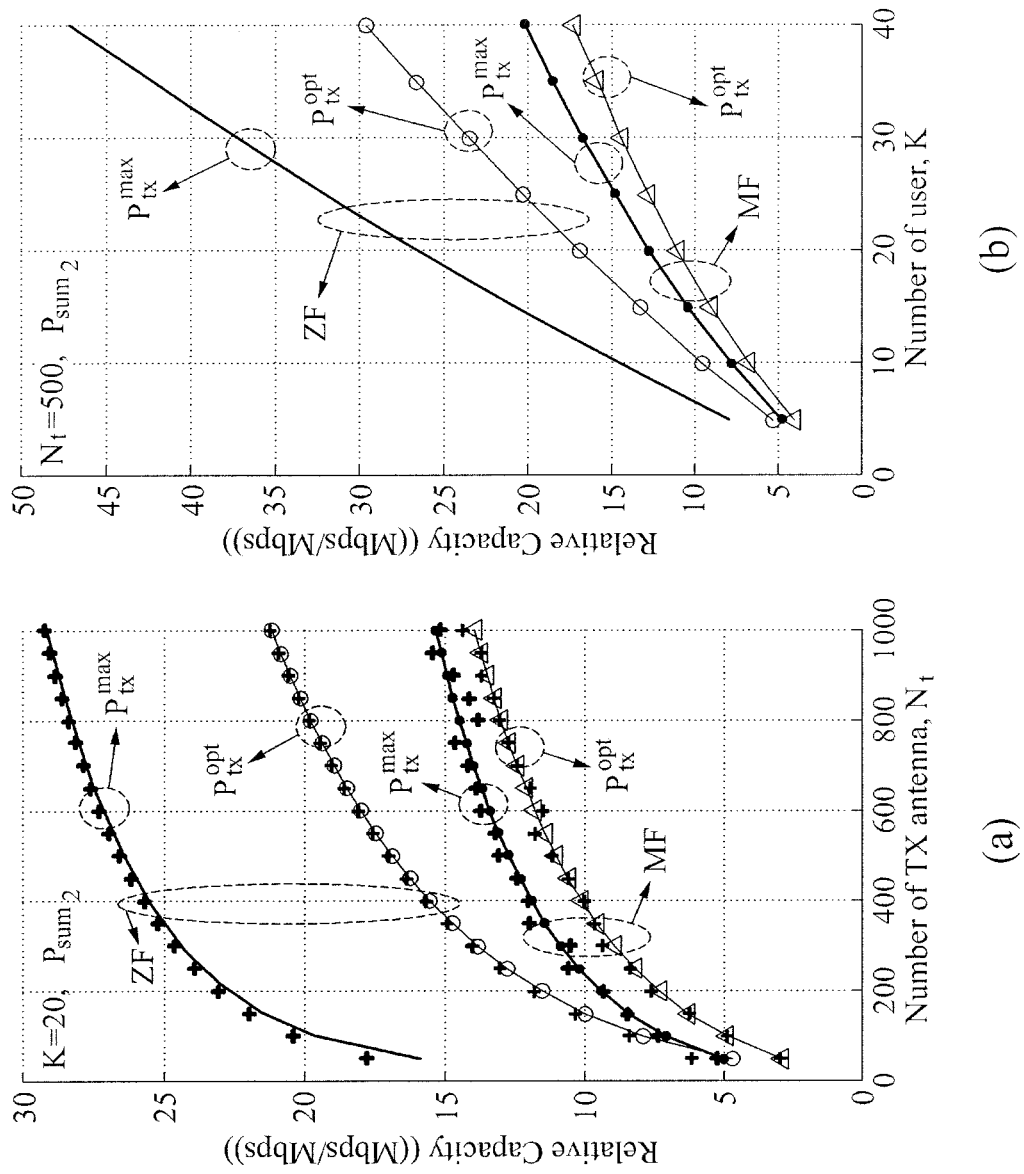
FIGS. 14A and 14B are diagrams illustrating examples of a capacity of a transmitter based on a number of antennas of the transmitter and a number of receivers according to various embodiments of the present disclosure.

FIG. 13 is a diagram illustrating an example of an energy efficiency based on a number of receivers according to various embodiments of the present disclosure.

FIG. 13 illustrates a result of comparing energy efficiencies based on the number of the receivers when a number "$N_t$" of antennas of a transmitter is fixed. Referring to FIG. 13, an energy efficiency obtained when ZF precoding is applied is higher than an energy efficiency obtained when MF precoding is applied. Also, in a case of identical precoding, an energy efficiency for an optimal transmission power decreases when the number of the receivers increases.

FIGS. 14A and 14B are diagrams illustrating examples of capacities of a transmitter based on a number of antennas of the transmitter and a number of receivers according to various embodiments of the present disclosure.

FIGS. 14A and 14B illustrate a result of comparing capacities of the transmitter based on the number of the antennas of the transmitter and the number of the receivers. Referring to FIGS. 14A and 14B, in a case in which the number of the receivers is fixed, a capacity of the transmitter increases when the number of the antennas of the transmitter increases. Here, a capacity of the transmitter when an optimal transmission power is applied may be lower than a capacity of the transmitter when a maximum transmission power is applied. However, as illustrated in FIGS. 12 and 13, applying the optimal transmission power may be more effective than applying the maximum transmission power based on an increase in the energy efficiency and a decrease in the capacity of the transmitter obtained when the optimal transmission power is applied.

Various embodiments of the present disclosure may include non-transitory computer-readable media including program instructions to implement various operations embodied by a computer. The media may also include, alone or in combination with the program instructions, data files, data structures, tables, and the like. The media and program instructions may be those specially designed and constructed for the purposes of various embodiments, or they may be of the kind well known and available to those having skill in the computer software arts. Examples of non-transitory computer-readable media include magnetic media such as hard disks, floppy disks, and magnetic tape, optical media such as CD ROM disks, magneto-optical media such as floptical disks, and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter. The described hardware devices may be configured to act as one or more software modules in order to perform the operations of the above-described various embodiments, or vice versa.

While the present disclosure has been shown and described with reference to various embodiments thereof, it will be understood by those skilled in the art that various changes in form and details may be made therein without departing from the scope and spirit of the present disclosure as defined by the appended claims and their equivalents.

The invention claimed is:

1. A method of increasing an energy efficiency of a transmitter in a multiple input multiple output (MIMO) system, the method comprising:
calculating a power consumption of a transmitter;
calculating a channel capacity of the transmitter;
identifying to apply one precoding scheme from a plurality of precoding schemes;
in a case that a first precoding scheme is applied:
determining a first transmission power for increasing an energy efficiency of the transmitter using a first equation based on the calculated channel capacity and a total transmission power, wherein interference in the first equation is expressed as a constant, and
controlling a power amplifier of the transmitter based on a parameter being used to determine the first transmission power for increasing the energy efficiency of the transmitter and the first precoding scheme; and
in a case that a second precoding scheme is applied:
determining a second transmission power for increasing the energy efficiency of the transmitter using a second equation, different from the first equation, based on the calculated channel capacity and the total transmission power, wherein interference in the second equation is expressed as a function of the transmission power, and
controlling the power amplifier of the transmitter based on a parameter being used to determine the second transmission power for increasing the energy efficiency of the transmitter and the second precoding scheme,
wherein the total transmission power is determined based on a power consumption of the power amplifier and an efficiency of the power amplifier,
wherein the energy efficiency of the transmitter is a ratio between the calculated power consumption and the calculated channel capacity,
wherein the first transmission power for increasing the energy efficiency of the transmitter or the second transmission power for increasing the energy efficiency of the transmitter is determined as a value increasing the energy efficiency of the transmitter based on a relationship between the total transmission power and the energy efficiency of the transmitter.

2. The method of claim 1, wherein the calculating of the power consumption comprises calculating the power consumption of the power amplifier and a power consumption of an internal circuit of the transmitter.

3. The method of claim 2, wherein the power consumption of the internal circuit is extracted based on a power consumption of a radio frequency (RF) front end of the transmitter.

4. The method of claim 1, wherein the calculating of the channel capacity is performed using a signal-to-interference-plus-noise ratio (SINR) of a receiver corresponding to the transmitter.

5. The method of claim 4, wherein the SINR of the receiver is determined based on a total transmission power of the transmitter, a number of antennas of the transmitter, a channel vector corresponding to the receiver, a bandwidth and a noise power, or a precoding vector corresponding to the receiver.

6. A device for increasing an energy efficiency of a transmitter in a multiple input multiple output (MIMO) system, the device comprising:
a transceiver configured to receive a transmission from the transmitter; and
at least one processor configured to:
calculate a power consumption of the transmitter,
calculate a channel capacity based on an interference,
identify to apply one precoding scheme from a plurality of precoding schemes,
in a case that a first precoding scheme is applied:
determine a first transmission power for increasing an energy efficiency of the transmitter using a first equation based on the calculated channel capacity and a total transmission power, wherein interference in the first equation is expressed as a constant, and
control a power amplifier of the transmitter based on a parameter being used to determine the first transmission power for increasing the energy efficiency of the transmitter and the first precoding scheme, and
in a case that a second precoding scheme is applied,
determine a second transmission power for increasing an energy efficiency of the transmitter using a second equation, different from the first equation, based on the calculated channel capacity and the total transmission power, wherein interference in the second equation is expressed as a function of the transmission power, and
control the power amplifier of the transmitter based on a parameter being used to determine the second transmission power for increasing the energy efficiency of the transmitter,
wherein the total transmission power is determined based on a power consumption of the power amplifier,
wherein the energy efficiency of the transmitter is a ratio between the calculated power consumption of the transmitter and the calculated channel capacity, and wherein the first transmission power for increasing the energy efficiency of the transmitter or the second transmission power for increasing the energy efficiency of the transmitter is determined as a value increasing the energy efficiency of the transmitter based on a relationship between the total transmission power and the energy efficiency of the transmitter.

7. The method of claim 1, wherein the plurality of precoding schemes includes a zero-forcing (ZF) precoding scheme and a matched filtering (MF) precoding scheme.

* * * * *